United States Patent [19]
Gubisch

[11] Patent Number: 5,057,783
[45] Date of Patent: Oct. 15, 1991

[54] AUTOMATIC IMPEDANCE MATCHING

[75] Inventor: Andrew Gubisch, Lexington, Mass.

[73] Assignee: Beckman Industrial Corporation, San Diego, Calif.

[21] Appl. No.: 480,783

[22] Filed: Feb. 16, 1990

[51] Int. Cl.[5] ........................ G01R 27/00; H03H 7/40
[52] U.S. Cl. .................................... 324/710; 324/642; 324/647; 324/533; 333/32
[58] Field of Search ................ 324/610, 603, 642-647, 324/532-535, 710, 637, 613; 379/24, 30; 333/32-34

[56] References Cited

U.S. PATENT DOCUMENTS 3,710,240 1/1973 Kuehnemann et al. ............ 324/533
4,484,131 11/1984 Jenkinson ....................... 324/647 X
4,853,950 8/1989 Crane .............................. 324/637 X
4,967,159 10/1990 Manes ............................. 324/642 X
4,970,466 11/1990 Bolles et al. ........................ 324/533

*Primary Examiner*—Jack B. Harvey
*Attorney, Agent, or Firm*—Polster, Polster and Lucchesi

[57] ABSTRACT

Apparatus (1) for performing an electrical test on a cable (3) used in local area networks (LAN's). A source (37) produces electrical signals transmitted through the cable. A resistance circuit (43) is interposed between the source and the cable. The amount of resistance interposed by the resistance circuit is adjusted using an adjustment circuit (67). A sensor (71) senses a characteristic of the signal and determines when that characteristic has a value representing an inpedance match between the source and the cable. The sensor circuit provides a command to the adjustment circuit to thereafter maintain the point of adjustment at which the impedances are matched.

9 Claims, 3 Drawing Sheets

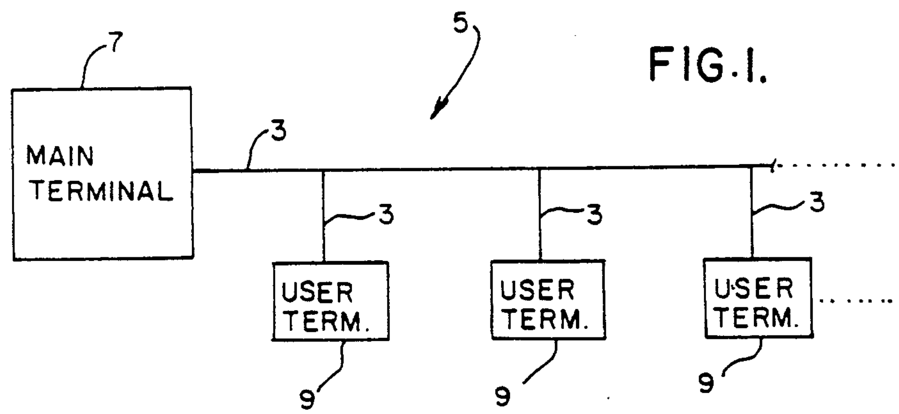
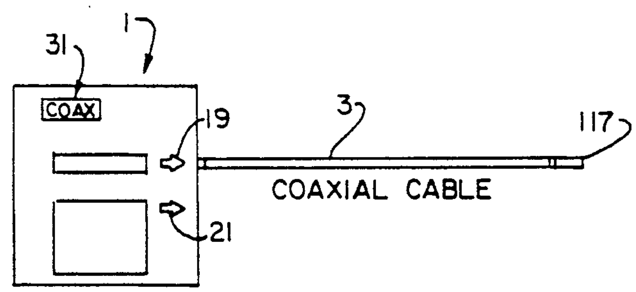
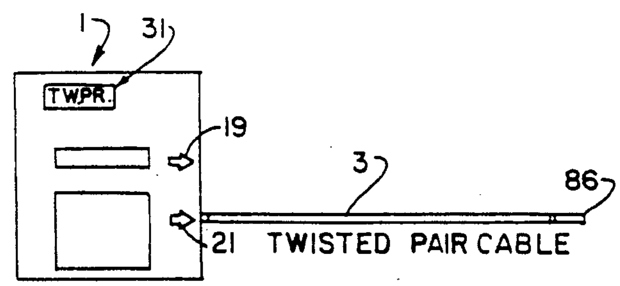
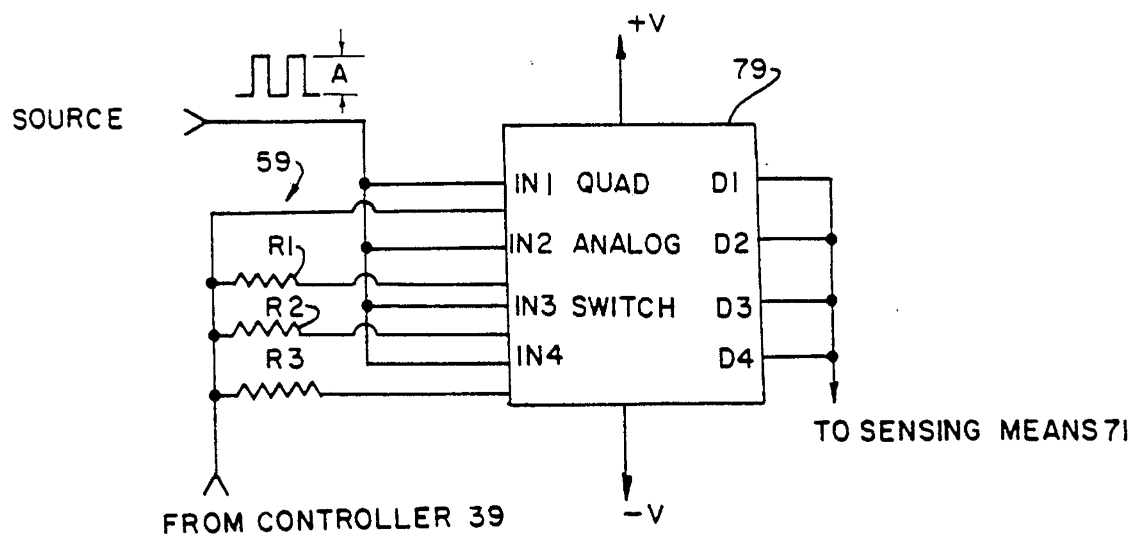
FIG. 5.

AUTOMATIC IMPEDANCE MATCHING

BACKGROUND OF THE INVENTION

This invention relates to electrical testing of data transmission cables and more particularly, to apparatus for automatically matching the impedance between the test instrumentation and a cable under test.

With the proliferation of local area networks (LAN's) for data communication, it is important during the installation and maintenance of the network, to be able to test the data transmission cables being used quickly and efficiently. Data transmission cables used in LAN's are either coaxial cables or twisted pair cables. To facilitate testing of both types of cable, a tester has been developed which permits both automated testing of a cable for such parameters as characteristic impedance, down-line impedance, overlimit values, and cable length; as well as allowing the user to perform a selected, individual test. A problem involved in the development of this instrument is that coaxial and twisted pair cables have a wide range of cable impedances; these values ranging, for example, from 50-ohms to 150-ohms.

Cables may be tested in a number of ways, one of these being the use of time domain reflectometry (TDR). In this technique, a signal, usually a pulse, is transmitted down the cable and the reflected pulse analyzed. If the signal source is not impedance matched to the cable under test, multiple reflections of the test signal will occur. This results in incorrect length and impedance measurements. One method of impedance matching is to manually switch separate baluns in and out of the circuit path between the signal source and the cable under test. This trial-and-error method will ultimately produce an impedance match; however, it is time consuming and does not lend itself to the other automatic features incorporated in the test instrument.

SUMMARY OF THE INVENTION

Among the several objects of the present invention may be noted the provision of apparatus for performing tests on transmission cables used in local area networks (LAN's); the provision of such apparatus which is useful with either coaxial cable or twisted pair cable; the provision of such apparatus which automatically performs a series of tests on a cable or which can be used to perform only a selected test; the provision of such apparatus which automatically matches the impedance of a signal source used in performing certain cable tests with the impedance of the cable; the provision of such apparatus in which impedance matching can be accomplished for a wide range of impedances; the provision of such test apparatus to use time domain reflectometry to perform certain of the cable tests; and, the provision of such test apparatus which is portable and easy to use.

In accordance with this invention, generally stated, apparatus is provided for performing an electrical test on a cable utilized in local area networks (LAN's) to determine the suitability of installed network transmission media to conduct network based data communications. The apparatus includes a source of electrical signals for transmission through the cable. A resistance network is interposed between the source and the cable. The amount of resistance is automatically adjusted. A sensor is provided for sensing a characteristic of the signal and for determining when that characteristic has a predetermined value which represents an impedance match between the source and the cable. The amount of resistance required to obtain the impedance match is thereafter maintained. Other objects and features will be in part apparent and in part pointed out hereinafter.

BRIEF DESCRIPTION OF THE DRAWINGS

In the drawings, FIG. 1 is a block diagram representation of a local area network (LAN);

FIG. 3A and 3B respectively illustrate the set-up for performing tests on a coaxial cable or a twisted pair cable;

Corresponding reference characters indicate corresponding parts throughout the several views of the drawings.

DESCRIPTION OF THE PREFERRED EMBODIMENT

Figure 2:
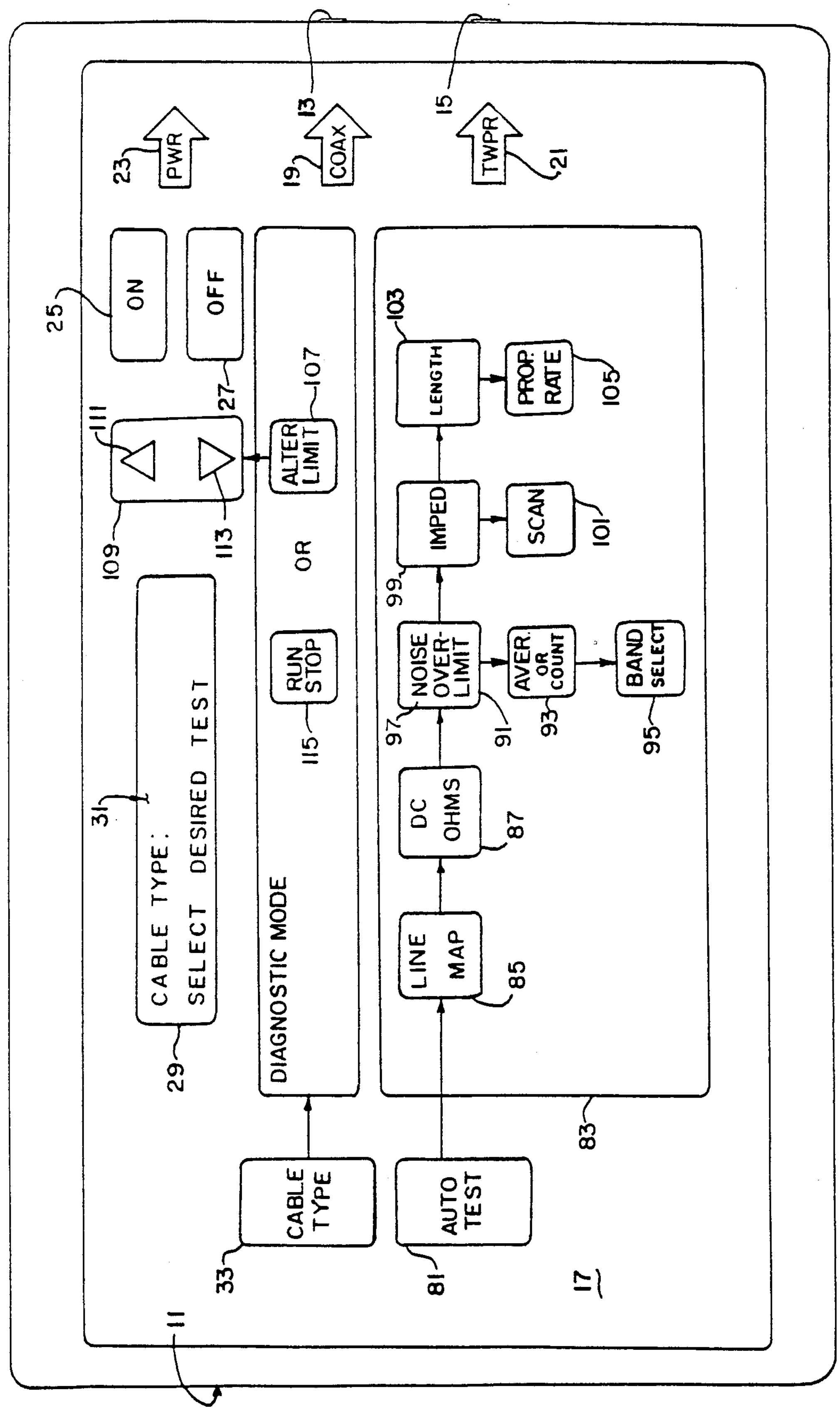
FIG. 2 is a top plan view of a apparatus for automatically or selectively performing tests on cables used in the LAN.

Referring to the drawings, apparatus for of the present invention is indicated generally 1 in the drawings. The apparatus 1 is used to perform one or more electrical tests on a cable 3 employed in a local area network (LAN) 5. The cable 3 is tested to determine its suitability as an installed network transmission media to conduct network based data communications.

As shown in FIG. 1, the LAN 5, as is well known in the art, typically includes, for example, a main or source computer terminal 7 and a number of user terminals 9. Data is transmitted back and forth between the main and user terminals over cables 3. If the cable is not up to certain standards with respect to data transmission, then erroneous information will be received at either end of the LAN. Depending upon configuration of the LAN, the cable 3 being used may be either a coaxial cable or a twisted pair cable. Because of the variety of coaxial and twisted pair cables available for use, their electrical or data transmission characteristics vary.

To validate a cable as to its transmission capabilities, it is sometimes necessary to perform one or more tests on it. For convenience, this testing should be done at the installation site, particularly when the LAN is already installed and problems are encountered in communicating over the network. It is a feature of apparatus 1 that it is a portable, hand-held device to which either coaxial or twisted pair cables are readily connectable for testing. As shown in FIG. 2, apparatus 1 is encased in a housing 11 and has appropriate coaxial and twisted pair cable connectors, 13 and 15 respectively, on one side for selectively attaching the apparatus to either type cable. A panel 17 is mounted on the top of the apparatus and is inscribed with various indicia to help a user operate the apparatus. For example, arrow emblems 19 and 21 on the right hand side of the panel indicate where respective coaxial or twisted pair cables can be connected to the apparatus. (See FIGS. 3A and 3B.) The apparatus can be battery operated, or connected to a source of external power. An arrow 23 at the upper right hand portion of the panel indicates the location on the side of the apparatus where it can be connected to an external power source. "ON" and "OFF" blocks, 25 and 27 respectively, at the upper right corner of the panel overlay pressure switches which, when touched by the user serve to turn the apparatus "on" or "off".

The middle portion of panel 17 has three sections. At the top is a window 29 overlaying a two-line, twenty (20) character, alphanumeric LCD display 31. To the lower left of this window is block 33 titled "CABLE TYPE". By pressing on this block, the display in window 29 will change to indicate the type of cable to be tested. The apparatus includes a memory chip 35 which contains, inter alia, the performance characteristics for coaxial and twisted pair cables. Pressing on block 33 activates a pressure switch beneath the block which causes the memory chip to successively step through both types of cable designations, and their associated performance characteristics, stored in its memory. When the appropriate cable designation is displayed in window 29, the performance characteristics for that cable are accessible by other portions of the apparatus for use during the tests to be performed.

Various of the tests performed on a cable require transmission of a pulse signal through the cable and an analysis of the pulse reflected back from the far end of the cable. For this to be done properly, it is first important to match the impedance between the apparatus and the cable. Otherwise, there will be multiple reflections from the cable under test which will cause, for example, incorrect cable length measurements and incorrect impedance measurements. For testing purposes, apparatus 1 includes a source of electrical pulses comprised by a pulse generator 37 (see FIG. 4). The pulse generator 37 is capable of generating more than one type pulse, the pulse generated at any one time being determined by an input from a controller 39 over an input line 41. (Controller 39 may, for example, be a microprocessor). For purposes of impedance matching, the generator 37 produces pulses having a 5 nanosecond (nsec.) rise time, for example. Further, the pulses have an amplitude indicated A1 in FIG. 4, this amplitude being, for example, 1 volt.

A resistance means indicated generally by the reference numeral 43 is interposed between generator 37 and a cable under test. A pulse output line 45 from generator 37 is connected to a resistance ladder 59 which comprises a plurality of parallel connected resistors R1–Rn. A short or very-low resistance line 61 is connected in parallel with the resistors at one end of the ladder. Each resistor has a different value; resistor R1 having a value of 68 ohms, for example, resistor R2 a value of 180 ohms, and resistor Rn a value of 330 ohms. It will be understood that ladder 59 may have more or fewer resistors than shown in FIG. 4, and the resistance values of the various resistors may differ from those values set out above. It should also be noted, however, that line 61 is adjacent the lowest value resistor and resistor R1 has a lower resistance value than resistor R2, etc, with resistor Rn having the highest resistance value.

A means 63 is provided for automatically adjusting the amount of resistance interposed by resistance means 43 during the impedance matching process. Means 63 includes a switch 65 having a plurality of contacts 65A–65n. The switch is "toggled" from one position to the next by a resistance adjustor circuit 67 which is responsive to resistance adjustment signals supplied to it from controller 39 over lines 69A–69N respectively. Switch 65 is always initially set such that the resistance of the network is, for example, 75 ohms. It will be understood that the actual resistance value is not important because it is calculated as part of a calibration routine. As will be appreciated, the signal A2 corresponds to the signal Al after passing through the resistance means 43. At each switch position, amplitude A2 of the pulse decreases because the signal is subjected to sequentially higher in-line resistance.

Figure 4:
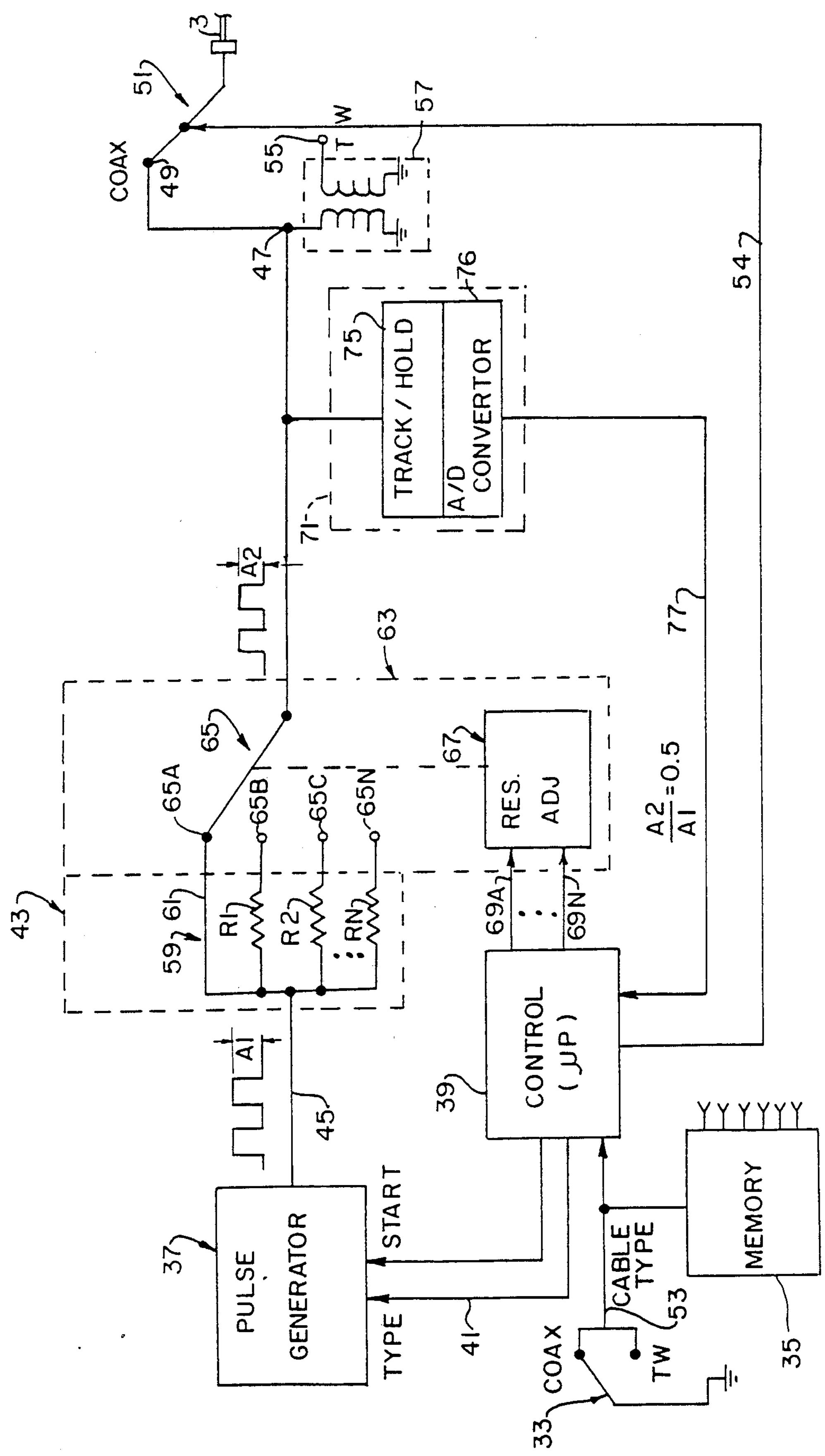
FIG. 4 is a block diagram of a portion of the apparatus by which an impedance match between the test apparatus and a cable is achieved; and, FIG. 5 is a partial schematic illustrating the impedance matching apparatus utilizing an analog switch and a microprocessor.

A means 71 is provided for sensing a characteristic of the signal from generator 37 and for determining when that characteristic has a value representing an impedance match between the source and the cable. Means 71 includes a track and hold circuit 75 and an analog-to-digital (A/D) converter 76. As shown in FIG. 4, the track and hold circuit and the converter measure the attenuated voltage A2 for the signal injected into the system. The result of the measurement is supplied to controller 39 over line 77. The controller uses the measured value (0.5, for example) to calculate the cable impedance. The controller then sends the appropriate signal to resistance adjustment circuit 67. This results in switch 65 being held at the setting at which the resistance matches the impedance of the cable under test.

The output line 78 from circuit 75 is bifurcated from means 71 at a junction point 47. One circuit path is to a switch contact 49 of a switch 51. When switch 33 is pressed to indicate a coaxial cable is being tested, a signal is provided over a line 53 to both memory chip 35 and controller 39. The controller then commands switch 51 to its coaxial cable position via a control line 54. The other circuit path from junction 47 is to a contact 55 of the switch. This contact is for a twisted pair cable and switch 51 is commanded to this switch setting when switch 33 indicates a twisted pair cable is being tested. A balun or transformer 57 is interposed in the circuit path between junction 47 and contact 55. The transformer serves to eliminate common-mode errors when line impedance and line length are being measured.

It is a feature of the apparatus that it be able to perform an impedance match for cables under test which have a characteristic impedance of between 50 ohms and 150 ohms. In addition, the circuitry involved may be implemented in different ways; for example, as shown in FIG. 5 by an analog switch 79. As shown in FIG. 5, switch 79 is a quad analog switch such as is well known in the art. Specifically, the switch is a model number IH5352 switch manufactured by Intersil Corporation of Cupertino, Calif. Pulses from generator 37 are supplied over line 45 and provided to the parallel inputs of switch 79 denoted IN1–IN4. The various resistance elements comprising resistance ladder 59 are connected to the switch so to present a series resistance to the pulses provided to the respective inputs. The switch has outputs D1–D4 which are commonly connected and which connect the switch to sensing means 71.

Once an impedance match has been achieved, the other tests are performed. A block 81 on panel 17 is labelled "AUTO TEST". Pressing on this block activates a pressure switch therebeneath which causes the following series of tests to be automatically performed. The tests are performed in the sequence indicated by the arrows in the block 83 outlined on the panel to the right of block 81.

a) If the cable under test is a twisted pair, a line mapping test is performed. Block 85, which is labelled "LINE MAP", indicates line map. Prior to performing this test, the twisted pair cable under test is terminated with a termination 86 that includes a network of fixed resistors. During this test, apparatus 1 puts out and monitors voltage levels on different twisted pair conductors of the cable to ensure correct end-to-end connectivity, and that the cable is free of short circuits, open circuits, and incorrectly paired wires. In all, fifteen (15) different measurements are made which test every possible combination of pins in the cable connector. The test identifies the ground line within the cable and all other lines with respect to it. The resistances used in this test range from 100 ohms to 3.3 K ohms.

b) Next, a D.C. resistance test is performed. This is the first test performed if cable 3 is a coaxial cable and the block 87 labelled "D.C. OHMS" indicates this test. If the cable is a coaxial cable, it is terminated and loop resistance of the cable is measured. If the cable is a twisted pair cable, two appropriate wires within the cable are terminated and a loop resistance of these wires is then measured. In performing the test, an auto-ranging, constant-current pulse circuit is used. If the voltage resulting from the first pulses supplied to the cable are overrange, controller 39 reduces the applied current until an in-range measurement is made. The measurement has a resolution of 0.1 ohms to detect short circuits and open circuits.

c) Noise measurements are performed as indicated by blocks 91, 93, and 95. Both RMS and impulse noise are measured. Further, the noise tests are made across one of three separate bands; 40 Hz-150 KHz, 40 Hz-20 MHz, or 20 MHz-200 MHz. An RMS circuit used for the one noise test includes an RC band-pass filter comprising several stages. Various of these stages can be switched in or out of the circuit by controller 39 to obtain one of the three noise bands referred to above. The output signal from these filters is rectified and digitized by an A/D converter.

For impulse noise measurement, a high speed comparator capable of distinguishing 10 nanosecond (nsec) events has one input connected to the cable under test. The other input of the comparator is connected to the output of a twelve bit D/A converter. The analog output of this converter establishes a noise threshhold below which noise impulses are disregarded and not counted. A fast 4-bit counter accumulates noise pulses exceeding the preset threshhold.

During either test, if there is excessive noise, an overlimit lamp 97 within block 91 illuminates.

d) An impedance test to determine the characteristic of the cable is performed as indicated by blocks 99 and 101. The characteristic impedance is determined for the range of 50 ohms-150 ohms and the measurement is made to a resolution of three decimal places. As with the impedance matching operation described earlier, the apparatus automatically impedance matches the cable under test with the source of the test pulses (i.e. generator 37).

e) Lastly, the apparatus measures both line length of the cable, as indicated by block 103, and the propagation rate of a signal along the cable, as indicated by block 105. The length test is accurate to +/− 30 cm. for a cable having a length of up to 600 m. Further, controller 39 automatically analyzes the reflected signals produced during this test. During the automatic testing cycle, readings obtained are automatically compared with high and low limit values to provide an immediate pass/fail evaluation of the cable being tested. The test limits for any particular reading can be modified by pressing a block 107 which is titled "ALTER LIMIT". A block 109 includes both an upper limit arrow 111 and a lower limit arrow 113. Each arrow has an associated switch which is used to adjust the appropriate limit when the alter limit function has been selected.

Apparatus 1 can also be used to run only one of the above outlined tests. To do this, "CABLE TYPE" block 33 is pressed until the appropriate cable identification appears in window 31. When it does, the operator then selects the test to be performed by pressing the appropriate block 85–105. Next, the RUN/STOP block 115 is pressed to begin the test and again to end it.

As noted, apparatus 1 is a portable, hand-held unit which is battery operated. The apparatus comes with various terminations, such as the terminal 86 referred to above and shown in FIG. 3B. Other terminations include an electrical short 117, see FIG. 3A. It will be understood that during the sequence of tests described above, the cables will at times have one or another of the terminations connected to them, or they may have no termination at all, so to prevent an open circuit to the apparatus.

Having thus described the invention, what is claimed and desired to be secured by Letters Patent is:

1. Apparatus for performing an electrical test on a cable utilized in local area networks (LAN's) to determine the suitability of installed network transmission media to conduct network based data communications comprising:

a pulse generator providing electrical signals for transmission through the cable;

resistance means interposed between the pulse generator and the cable, the resistance means including a plurality of resistors arranged in a resistance ladder with the resistors each being selectively switchable into a circuit path between the generator and the cable;

means for automatically adjusting the value of resistance interposed by the resistance means, the adjusting means switching resistors into and out of circuit path;

means for sensing the amplitude of the signals and for determining when that amplitude has a value representing an impedance match between the pulse generator and the cable, said match being indicated by the amplitude of the signals on the output side of the resistance means being one-half the amplitude on the pulse generator side thereof; and control means responsive to the sensing means for commanding the adjusting means to thereafter maintain the adjustment at which the impedances are matched.

2. The apparatus of claim 1 further including means for automatically performing a series of electrical tests on the cable.

3. The apparatus of claim 1 further including means for selectively performing one of a series of electrical test on the cable.

4. The apparatus of claim 1 wherein the control means comprises an analog switch.

5. The apparatus of claim 1 wherein the control means comprises a microprocessor.

6. The apparatus of claim 1 which is useful for testing both coaxial cables and twisted pair cables, the apparatus further including transformer means interposed between the pulse generator and the cable under test when a twisted pair cable is being tested.

7. The apparatus of claim 1 wherein the resistance means is capable of matching the impedance of a cable under test having an impedance range of 50 ohms to 150 ohms.

8. A portable tester for performing electrical tests on at least two types of cables used in data communication, comprising:

a hand held enclosure having an input/output electrical connection being adapted to connect a cable under test to the enclosure;

signal generator means mounted in the enclosure for providing electrical signals to a cable connected to the enclosure for testing;

resistance means interposed between the signal generator and the input/output electrical connection, the resistance means including a plurality of resistors arranged in a resistance ladder with each of the resistors being selectively switchable into a circuit path between the generator means and the cable;

means electrically connected to the resistance means for automatically adjusting the resistance value of the resistance means by switching resistors into and out of the circuit path;

means for sensing the amplitude of the signals from said resistance means and for determining when the amplitude has a value representing an impedance match between the pulse generator and the cable, said match being indicated by the amplitude of the signals on the output side of the resistance means being one-half the amplitude on the signal generator side thereof; and, control means responsive to the sensing means for commanding the adjustment means to thereafter maintain its adjustment setting at which the impedances are matched.

9. The tester of claim 8 further including means for automatically performing a series of electrical tests on the cable.

* * * * *